(12) United States Patent
Manning

(10) Patent No.: US 7,208,836 B2
(45) Date of Patent: *Apr. 24, 2007

(54) INTEGRATED CIRCUITRY AND A SEMICONDUCTOR PROCESSING METHOD OF FORMING A SERIES OF CONDUCTIVE LINES

(75) Inventor: Monte Manning, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/648,886

(22) Filed: Aug. 26, 2003

(65) Prior Publication Data

US 2005/0035456 A1    Feb. 17, 2005

Related U.S. Application Data

(63) Continuation of application No. 09/526,797, filed on Apr. 22, 1997, now Pat. No. 6,611,059, which is a continuation of application No. 08/597,196, filed on Feb. 6, 1996, now abandoned.

(51) Int. Cl.
    *H01L 23/48*    (2006.01)
    *H01L 23/58*    (2006.01)
(52) U.S. Cl. ............... 257/758; 257/635; 257/638; 257/644; 257/650
(58) Field of Classification Search ........... 257/632, 257/635, 638, 641, 644, 650, 754–758, 765, 257/771, 774
See application file for complete search history.

(56) References Cited

U.S. PATENT DOCUMENTS

| | | |
|---|---|---|
| 4,418,239 A | 11/1983 | Larson |
| 4,686,759 A | 8/1987 | Pals |
| 4,693,530 A | 9/1987 | Stillie |
| 4,780,394 A | 10/1988 | Blanchard |
| 4,781,620 A | 11/1988 | Tengler |

(Continued)

FOREIGN PATENT DOCUMENTS

JP        054925        2/1990

(Continued)

OTHER PUBLICATIONS

Thomas, Michael E. "VLSI Multilevel Micro-Coaxial Interconnects for High Speed Devices", 1990, IEEE, pp. 55-58.

*Primary Examiner*—Ori Nadav
(74) *Attorney, Agent, or Firm*—Wells St. John P.S.

(57) ABSTRACT

A semiconductor processing method of forming a plurality of conductive lines includes, a) providing a substrate; b) providing a first conductive material layer over the substrate; c) providing a first insulating material layer over the first conductive layer; d) etching through the first insulating layer and the first conductive layer to the substrate to both form a plurality of first conductive lines from the first conductive layer and provide a plurality of grooves between the first lines, the first lines being capped by first insulating layer material, the first lines having respective sidewalls; e) electrically insulating the first line sidewalls; and f) after insulating the sidewalls, providing the grooves with a second conductive material to form a plurality of second lines within the grooves which alternate with the first lines. Integrated circuitry formed according to the method, and other methods, is also disclosed.

4 Claims, 4 Drawing Sheets

U.S. PATENT DOCUMENTS

| | | |
|---|---|---|
| 4,922,323 A | 5/1990 | Potter |
| 4,933,743 A | 6/1990 | Thomas |
| 4,984,055 A | 1/1991 | Okumura et al. |
| 5,000,818 A | 3/1991 | Thomas |
| 5,028,981 A | 7/1991 | Eguchi |
| 5,117,276 A | 5/1992 | Thomas |
| 5,123,325 A | 6/1992 | Turner |
| 5,176,538 A | 1/1993 | Hansell, III |
| 5,323,048 A | 6/1994 | Onuma |
| 5,329,155 A | 7/1994 | Lao |
| 5,378,646 A | 1/1995 | Huang et al. |
| 5,407,860 A | 4/1995 | Stoltz et al. |
| 5,413,961 A | 5/1995 | Kim |
| 5,413,962 A * | 5/1995 | Lur et al. .................. 438/619 |
| 5,418,187 A * | 5/1995 | Miyanaga et al. .......... 438/607 |
| 5,451,551 A | 9/1995 | Krishman et al. |
| 5,471,093 A | 11/1995 | Cheung |
| 5,519,239 A * | 5/1996 | Chu ........................... 257/314 |
| 5,552,628 A | 9/1996 | Watanabe |
| 5,583,357 A * | 12/1996 | Choe .......................... 257/296 |
| 5,585,664 A | 12/1996 | Ito |
| 5,654,917 A | 8/1997 | Ogura |
| 5,656,543 A | 8/1997 | Chung |
| 5,719,075 A | 2/1998 | Hawkins et al. |
| 5,858,865 A | 1/1999 | Juengling et al. |
| 5,956,615 A | 9/1999 | Nguyen et al. |

FOREIGN PATENT DOCUMENTS

| | | |
|---|---|---|
| JP | 0097300 | 4/1994 |

* cited by examiner

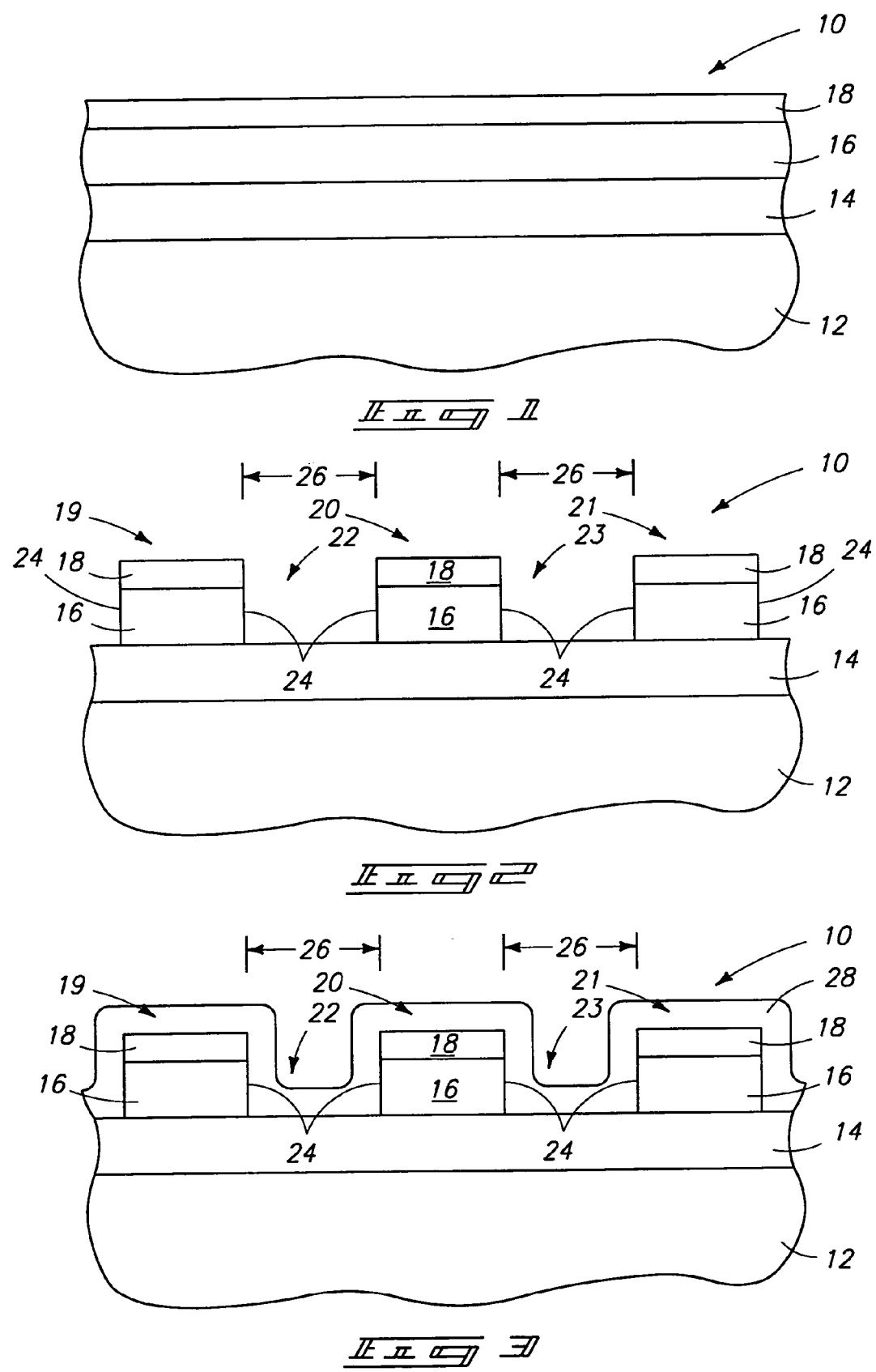

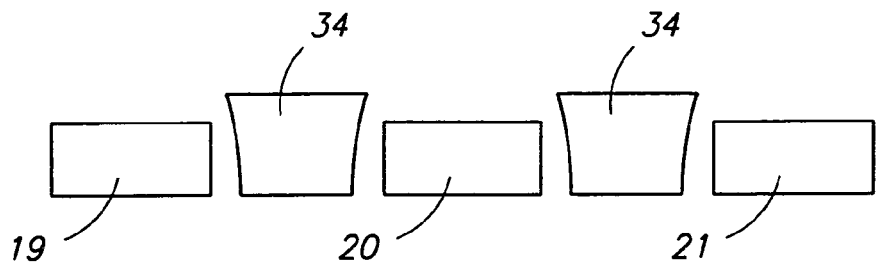
_FIG_ 7
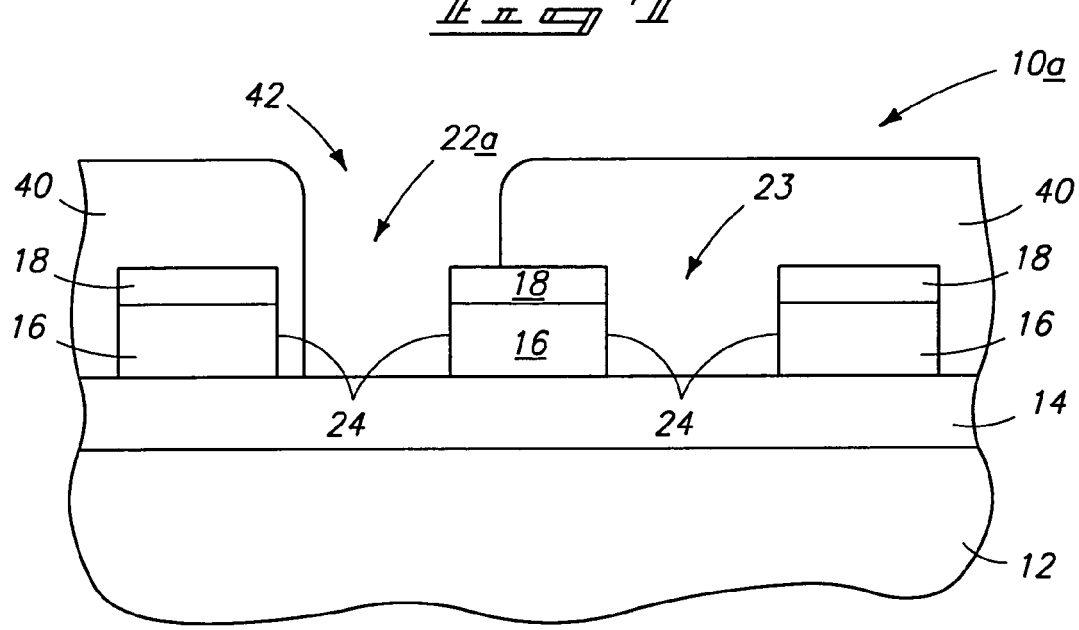
_FIG_ 8
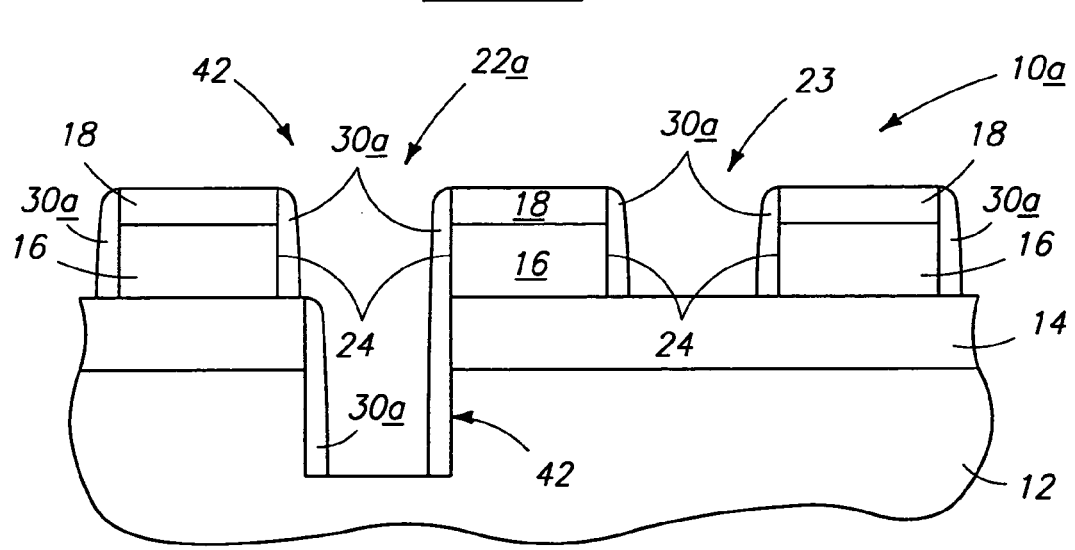
_FIG_ 9

INTEGRATED CIRCUITRY AND A SEMICONDUCTOR PROCESSING METHOD OF FORMING A SERIES OF CONDUCTIVE LINES

RELATED PATENT DATA

This patent resulted from a continuation application of U.S. patent application Ser. No. 09/526,797, filed on Apr. 22, 1997 now U.S. Pat. No.6,611,059 which resulted from a file wrapper continuation application of application Ser. No. 08/597,196, filed Feb. 6, 1996, now abandoned and entitled "Integrated Circuitry and a Semiconductor Processing Method of Forming a Series of Conductive Lines", naming Monte Manning as the inventor. This Patent is also related to application Ser. No. 08/742,782, now U.S. Pat. No. 6,096,636, issued Aug. 1, 2000, which is a divisional application of application Ser. No. 08/597,196, now abandoned.

PATENT RIGHTS STATEMENT

This invention was made with Government support under Contract No. MDA972-92-C-0054 awarded by Advanced Research Projects Agency (ARPA). The Government has certain rights in this invention.

TECHNICAL FIELD

This invention relates to semiconductor processing methods of forming a series of conductive lines and to integrated circuitry having a series of conductive lines.

BACKGROUND OF THE INVENTION

The high speed operation of future higher density integrated circuits will be dictated by interconnect response. Realization of such high speed circuitry is impacted by cross-talk between different adjacent interconnect lines. Cross-talk imposes the biggest constraint on high speed operation when frequencies exceed 500 MHz. Lowering the conductive line resistivity or the dielectric constant of insulators interposed between conductive metal lines is not expected to inherently solve the cross-talk problem. In addition, the gain in system response is only enhanced by a factor of 3, at best, when these changes are ideally integrated into manufacturing processes.

Future circuits will also incorporate higher drive devices. In such situations, as the circuits change state (e.g., from high voltage to low voltage in a CMOS circuit), the interconnect line that carries the signal to the next active device will often be closely spaced to another interconnect line whose driver is not changing state. However given the speed of the voltage change on the first line and the spacing from the second, capacitive coupling will undesirably cause the second line to follow the first .momentarily. This situation is made worse when the device driving the second line is small compared to the driver switching the first line. Here, the driver driving the second line does not have enough drive to maintain the output line's desired voltage during the first line's transition from high voltage to low voltage. Therefore, the second line follows the first. This can cause upset in circuits tied to the second line and cause the chip to fail or temporarily operate incorrectly.

One prior art technique to decouple adjacent interconnect lines is to fully enclose lines in a conductive shield, such as a coaxial sheath around a central core interconnect line. Such processing to produce such construction is however complex, and alternate methods and resultant circuitry constructions are desired.

BRIEF DESCRIPTION OF THE DRAWINGS

Preferred embodiments of the invention are described below with reference to the following accompanying drawings.

FIG. 1 is a diagrammatic sectional view of a semiconductor wafer fragment at one processing step in accordance with the invention.

FIG. 2 is a view of the FIG. 1 wafer fragment at a processing step subsequent to that shown by FIG. 1.

FIG. 3 is a view of the FIG. 1 wafer fragment at a processing step subsequent to that shown by FIG. 2.

FIG. 7 is a diagrammatic representation intended to emphasize conductive line cross-sectional shapes.

FIG. 8 is a view of the FIG. 1 wafer fragment at an alternate processing step subsequent to that shown by FIG. 2.

FIG. 9 is a view of the FIG. 8 wafer fragment at a processing step subsequent to that shown by FIG. 8.

DETAILED DESCRIPTION OF THE PREFERRED EMBODIMENTS

Figure 4:
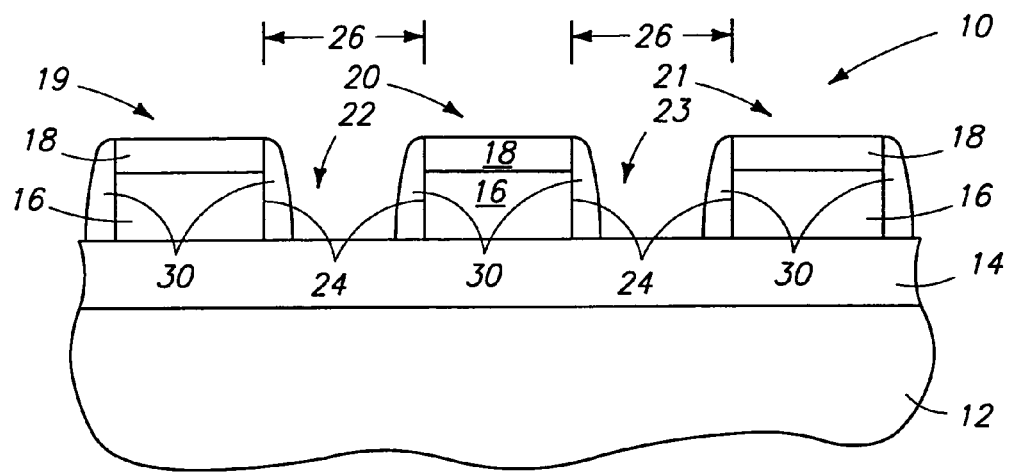
FIG. 4 is a view of the FIG. 1 wafer fragment at a processing step subsequent to that shown by FIG. 3.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming a plurality of conductive lines comprises the following steps:

providing a substrate;

providing a first conductive material layer over the substrate;

etching through the first conductive layer to the substrate to both form a plurality of first conductive lines from the first conductive layer and provide a plurality of grooves between the first lines, the first lines having respective sidewalls;

electrically insulating the first line sidewalls; and after insulating the sidewalls, providing the grooves with a second conductive material to form a plurality of second lines within the grooves which alternate with the first lines.

In accordance with another aspect of the invention, integrated circuitry comprises:

a substrate; and a series of alternating first and second conductive lines provided relative to the substrate, the first and second lines being spaced and positioned laterally adjacent one another relative to the substrate, the first lines and the second lines being electrically isolated from one another laterally by intervening anisotropically etched insulating spacers formed laterally about only one of the first or second series of lines.

In accordance with still a further aspect of the invention, integrated circuitry comprises:

a substrate; and a series of alternating first and second conductive lines provided relative to the substrate, the first and second lines being spaced and positioned laterally adjacent one another relative to the substrate, the first lines and the second lines being electrically isolated from one another laterally by intervening strips of insulating material, the first lines having a substantially common lateral cross sectional shape and the second lines having a substantially common lateral cross sectional shape, the first lines' lateral cross sectional shape being different from the second lines' lateral cross sectional shape.

Referring first to FIG. 1, a semiconductor wafer fragment in process is indicated generally with reference numeral 10. Such comprises a bulk monocrystalline silicon wafer 12 and an overlying electrical insulating layer 14. An example material for layer 14 is borophosphosilicate glass (BPSG). A first electrically conductive material layer 16 is provided over substrate 14. An example material for layer 16 is doped or undoped polysilicon deposited to an example thickness range of from 2000 Angstroms to 10,000 Angstroms. Other conductive materials, such as metal, might also be provided although polysilicon is preferred due to its resistance to subsequent high temperature processing.

In accordance with the preferred embodiment, layer 16 will ultimately be utilized as a cross-talk shield between otherwise adjacent conductive lines. Accordingly, its degree of conductivity should be effective to function in this regard. It can in essence be a semiconductive material, such as undoped polysilicon which will have effective conductivity to function as a cross-talk shield.

A first insulating layer 18 is provided over first conductive layer 16. An example and preferred material for layer 18 is $SiO_2$ deposited by decomposition of tetraethylorthosilicate (TEOS).

Referring to FIG. 2, first insulating layer 18 and first conductive layer 16 are photopatterned and etched through to substrate 14 to form a plurality of first conductive lines 19, 20, and 21 from first conductive layer 16 and provide a plurality of grooves 22 and 23 between first lines 19, 20, and 21. Accordingly in the preferred embodiment, first lines 19, 20, and 21 are capped by first insulating layer material 18. For purposes of continuing discussion, first lines 19, 20, and 21 have respective sidewalls 24. Also, grooves 22 and 23 have respective open widths 26, with 5000 Angstroms being an example.

Referring to FIG. 3, a second insulating material layer 28 is deposited over etched first insulating layer 18 and first conductive layer 16, and over first line sidewalls 24, to a thickness which is less than one-half the respective groove open widths 26 to less than completely fill grooves 22 and 23. An example and preferred material for layer 28 is $SiO_2$ deposited by decomposition of TEOS, to an example thickness of 1000 Angstroms.

Referring to FIG. 4, second insulating material layer 28 is anisotropically etched to define insulating sidewall spacers 30 over first line sidewalls 24. Such provides but one example of electrically insulating first line sidewalls 24. Sidewall oxidation or other techniques could be utilized. First insulating material 18 and second insulating material 28 can constitute the same or different materials. In the described and preferred embodiment, each predominantly comprises $SiO_2$ which is substantially undoped. Alternately, one or both could be doped with phosphorus, boron or some other suitable dopant.

Figure 5:
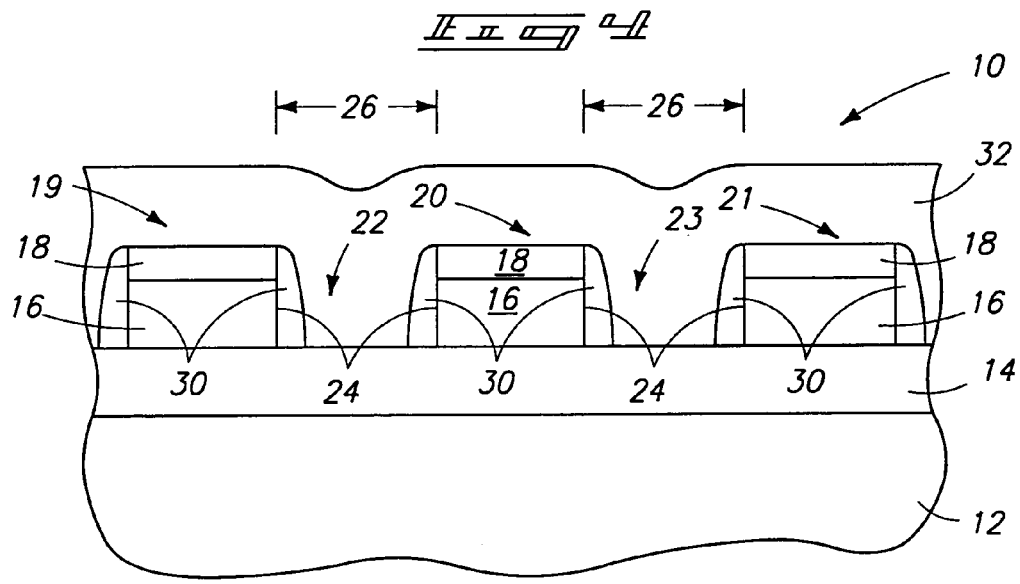
FIG. 5 is a view of the FIG. 1 wafer fragment at a processing step subsequent to that shown by FIG. 4.

Referring to FIG. 5, a second conductive material layer 32 is deposited to a thickness effective to fill remaining portions of grooves 22 and 23.

Figure 6:
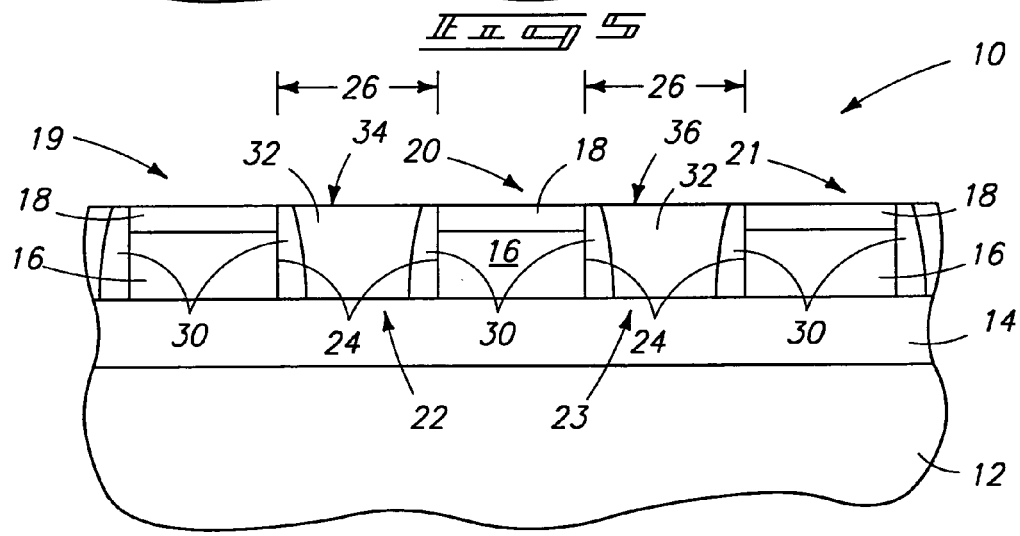
FIG. 6 is a view of the FIG. 1 wafer fragment at a processing step subsequent to that shown by FIG. 5.

Referring to FIG. 6, second conductive material layer 32 is planarize etched to form a plurality of second lines 34, 36 within grooves 22 and 23 which alternate with first lines 19, 20 and 21. Such provides but one example of a preferred method of providing grooves 22 and 23 with effectively conductive interconnect lines therein. Second conductive material 32 can be the same as or different from first conductive material 16. An example and preferred material for layer 32, and accordingly resultant lines 34 and 36 is metal, such as aluminum or an aluminum alloy. In such a preferred embodiment, interconnect lines 34 and 36 constitute desired resultant conductive lines, with the series of first lines 19, 20 and 21 providing effective shielding therebetween. Again, the shielding lines only need be effectively electrically conductive to shield one interconnect line from the adjacent interconnect line. Such shielded lines may be biased to some suitable voltage, or left unbiased. Alternately in accordance with an aspect of the invention, the functions and compositions of the first and second sets of conductive lines can be reversed, whereby lines 34, 36 function as effective shielding between conductive lines 19, 20 and 21.

Accordingly, a method and construction are described whereby a series of conductive lines 19, 20 and 21 are positioned laterally adjacent another set of conductive lines 34, 36. Such are isolated from one another laterally by intervening strips of insulating material, which in the preferred embodiment constitute intervening anisotropically etched insulating spacers formed laterally about only first series of lines 19, 20 and 21. Further in accordance with an aspect of the invention, first lines 19, 20 and 21 have a substantially common lateral cross-sectional shape, and second lines 34 and 36 also have a substantially common lateral cross-sectional shape. Yet, the first lines' 19, 20 and 21 lateral cross-sectional shape is different from that of the second lines' lateral cross-sectional shape. This is most readily apparent from FIG. 7, wherein other layers have been deleted to emphasize the respective shapes of the first and second lines.

An alternate described embodiment whereby contact openings are provided is described with reference to FIGS. 8 and 9. Like numerals from the first described embodiment are utilized where appropriate with differences being indicated by the suffix "a" or with different numerals. FIG. 8 illustrates a semiconductor wafer fragment 10*a* at a processing step immediately subsequent to that depicted by FIG. 2. Here, a photoresist masking layer 40 has been deposited and patterned as shown for formation of a desired contact opening 42. FIG. 9 illustrates such contact opening 42 having been formed, followed by subsequent deposition and anisotropic etching to produce the illustrated spacers 30*a*. Subsequent deposition of a second conductive layer and planarized etching thereof, again preferably without photomasking, would subsequently occur.

Figure 10:
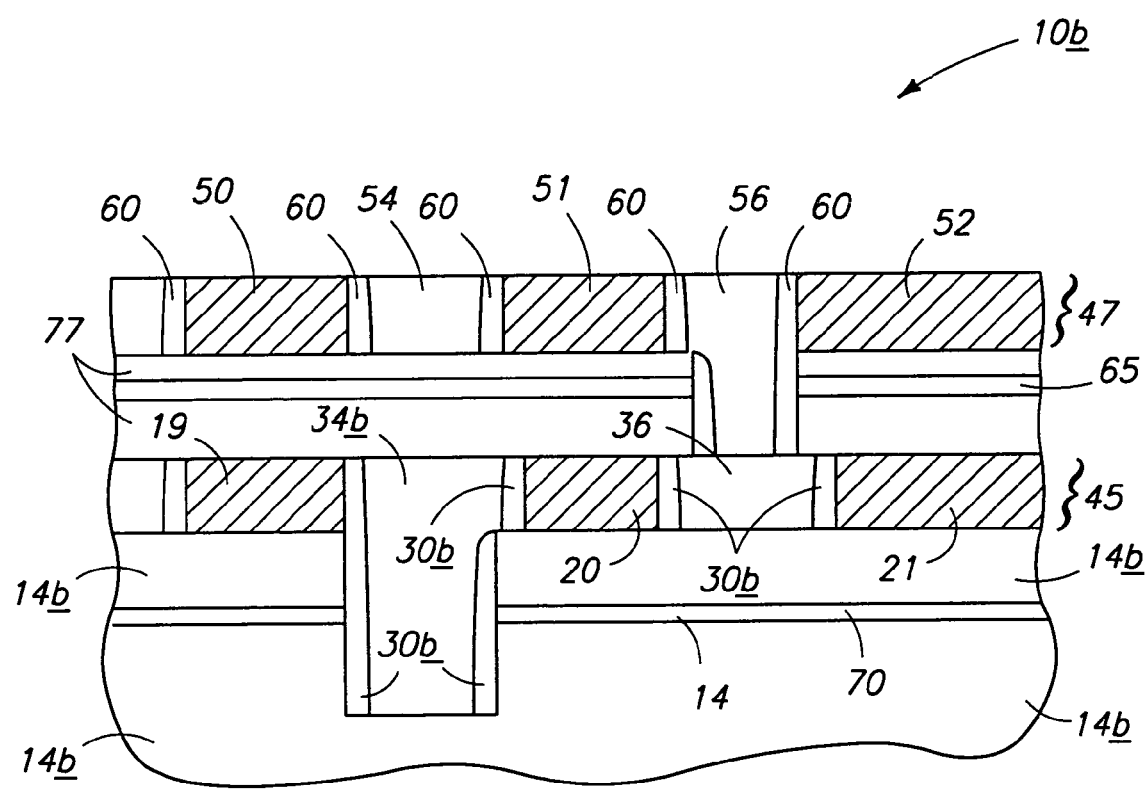
FIG. 10 is a view of an alternate embodiment semiconductor wafer fragment in accordance with the invention.

FIG. 10 illustrates yet another alternate embodiment wafer fragment 10*b*. Like numerals from the first described embodiment are utilized where appropriate, with differences being indicated by the suffix "b" or with different numerals. FIG. 10 illustrates an alternate conception whereby a plurality of series of the first and second conductive lines are formed at multiple elevations relative to substrate 14*b*. A region 45 illustrates one elevation relative to substrate 14*b* where first series of first lines 19, 20 and 21 and second lines 34*b* and 36 are formed. A region of elevation 47 shows an additional level where a second series of first lines 50, 51 and 52, and second lines 54 and 56 are provided, utilizing intervening anisotropically etched insulating spacers 60.

An interlevel dielectric layer construction 77 is provided between the two line sets. Additional separate horizontal intervening shielding layers 65 and 70 can and are provided relative to the interlevel dielectric layers 77 and 14b, respectively, to afford desired cross-talk shielding between the different levels of first and second conductive lines. Further in the depicted embodiment, line 34b is shown to extend downwardly for electrical contact with a different level. Likewise, line 56 from elevation 47 effectively extends downwardly to make electrical contact with line 36. If desired, all such shields in either embodiment may be interconnected and connected to a suitable potential.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. Integrated circuitry comprising:
   a semiconductive substrate;
   an electrically insulative borophosphosilicate glass (BPSG) layer over the semiconductive substrate;
   a series of first conductive polysilicon lines directly on and in contact with the BPSG layer, the first series conductive lines having individual pairs of respective sidewalls;
   electrically insulative oxide material on and in contact with respective first series conductive lines, a top of the insulative oxide material over at least some of the first series conductive lines defining a first plane;
   a plurality of insulative oxide sidewall spacer pairs, individual spacer pairs being on respective sidewall pairs of individual first series conductive lines, having respective spacer tops that are coplanar with the first plane, and being connected with the electrically insulative oxide material;
   individual first series conductive lines being effectively insulated by the BPSG layer, the respective sidewall spacer pairs, and the respective insulative oxide material; and
   a series of second conductive aluminum-containing lines having respective line tops at least some of which define a second plane that is coplanar with said first plane, the series of second conductive lines being directly on and in contact with the BPSG layer and the first series conductive lines providing cross-talk shielding for the second series conductive lines.

2. The integrated circuitry of claim 1, wherein first series conductive lines have elevational thicknesses in a range from 2000 Angstroms to 10,000 Angstroms.

3. The integrated circuitry of claim 1, wherein individual second series conductive lines have substantially a common lateral cross sectional shape.

4. The integrated circuitry of claim 1 wherein the first conductive lines and the second conductive lines are electrically isolated from one another laterally solely by the spacers.

* * * * *